United States Patent [19]

McAuliffe

[11] Patent Number: 4,520,353

[45] Date of Patent: May 28, 1985

[54] STATE OF CHARGE INDICATOR

[75] Inventor: Robert E. McAuliffe, Lincoln, Nebr.

[73] Assignee: Outboard Marine Corporation, Waukegan, Ill.

[21] Appl. No.: 362,548

[22] Filed: Mar. 26, 1982

[51] Int. Cl.³ ............................................. G08B 21/00
[52] U.S. Cl. ..................................... 340/636; 324/429
[58] Field of Search .................. 340/636; 320/13, 48, 320/21; 324/427, 428, 429, 433

[56] References Cited

U.S. PATENT DOCUMENTS

| | | | |
|---|---|---|---|
| 3,529,230 | 9/1970 | Tedd | 340/636 X |
| 4,080,560 | 3/1978 | Abert | 324/429 |
| 4,377,787 | 3/1983 | Kikuoka et al. | 324/427 X |
| 4,423,378 | 12/1983 | Marino et al. | 340/636 X |
| 4,423,379 | 12/1983 | Jacobs et al. | 340/636 X |

FOREIGN PATENT DOCUMENTS

2742675 4/1979 Fed. Rep. of Germany ...... 340/636

Primary Examiner—James L. Rowland
Assistant Examiner—Daniel Myer
Attorney, Agent, or Firm—Michael, Best & Friedrich

[57] ABSTRACT

A method and apparatus for producing a visual signal of the state of charge of a battery selectively connected and disconnected from an external load. A test load is connected to the battery for a predetermined period of time to draw a current pulse from the battery when the battery is disconnected from the external load. Simultaneously, the voltage of the battery is measured. The measured voltage is converted to a digital signal, and the digital signal is transmitted to a storage means. The stored signal is then transmitted to a visual display device.

25 Claims, 6 Drawing Figures

STATE OF CHARGE INDICATOR

FIELD OF THE INVENTION

The invention relates to apparatus for indicating the state of charge of a battery or batteries, such apparatus being useful, by way of example, in electric vehicles having lead-acid batteries.

BACKGROUND PRIOR ART

In an electric vehicle of the type employing lead-acid batteries, it is desirable for the driver to have a continuous reading of the state of charge of the batteries in the vehicle. One characteristic of lead-acid batteries is that the discharge curve of the batteries is not linear, that is, the terminal voltage of the batteries tends to remain fairly constant during initial discharge of the batteries when the batteries are discharged at a constant current draw, but the voltage tends to decrease relatively rapidly as the battery approaches its fully discharged state. Despite this characteristic of the batteries commonly used in an electric vehicle, it is necessary that the state of charge indicator provide an accurate readout of the charge remaining in the battery throughout the period of discharge of the battery.

SUMMARY OF THE INVENTION

The state of charge indicator embodying the invention employs the concept that when a battery, such as a typical lead-acid battery, is discharged at a constant current rate, the state of charge of the battery is related to the voltage measured at the battery terminals during the discharge. For example, in batteries having a nominal voltage of 12 volts and designed to produce a current of 25 amperes, the battery is considered fully discharged when the terminal voltage of a battery normally having a 12 volt capacity falls to approximately 10.5 volts at a discharge rate of 25 amperes. The state of charge indicator embodying the invention repeatedly and selectively draws a relatively large predetermined current from the battery for very short periods of time and samples the voltage across the terminals of the battery each time the predetermined current is drawn from the battery.

More particularly, the invention includes a method for producing a visual signal of the state of charge of a battery selectively connected and disconnected from an external load. The method includes the steps of selectively connecting an electrical test load to the battery for a predetermined period of time to draw a predetermined current pulse from the battery while the battery is disconnected from the external load, and sensing the voltage across the battery terminals when the test load is connected to the battery terminals. The method further includes the steps of converting the sensed voltage to a visual signal of the state of charge of the battery.

The invention also includes a method for producing a visual signal of the state of charge of a battery having a non-linear battery voltage discharge curve. The method comprises the steps of selectively connecting a predetermined electrical test load to the battery for a predetermined period of time to draw a current pulse from the battery while the battery is disconnected from the external electrical load, sensing the voltage of the battery when the selected electrical test load is connected to the battery terminals, and electrically processing the sensed voltage to compensate for the non-linear battery discharge curve to provide a linear visual signal of the state of charge of the battery.

In a preferred embodiment of the method of the invention the current drawn from the battery by the test load approximates the current drawn by the external load when the external load is selectively connected to the battery.

In a preferred embodiment of the method of the invention the selected test load is connected to the battery after the battery has been connected to the external load for a selected period of time and after the battery has subsequently been disconnected from the external load for a selected period of time.

The invention also includes a method for repeatedly testing the charge of a battery which is operably connected and disconnected from an external load, the method including selectively connecting a selected resistance to the battery for a selected time interval to produce a pulse of current from the battery, sensing the voltage of the battery during the interval, converting the sensed voltage to a digital signal, transmitting the digital signal to a digital signal storage means at a selected time, converting the digital signal stored in the storage means to a visible display and disconnecting the selected resistance from the terminals.

In one embodiment of the method of the invention the selected resistance is connected to the battery after the battery has been connected to the external load for a selected period of time and after the battery has subsequently been disconnected from the external load for a selected period of time.

In a preferred embodiment of the method of the invention, the method further includes the step of delaying transmission of the digital signal to the digital signal storage for a selected period of time.

In a preferred embodiment of the method of the invention the step of converting the digital signal to a visible display includes transmitting signals to a plurality of selectively illuminated display elements and so as to cause a decreasing number of the display elements to be illuminated as the voltage sensed decreases.

The invention also includes apparatus for measuring the state of charge of a battery selectively connected to and disconnected from an external load, the apparatus including an electrical test load means for selectively connecting the selected electrical test load to the battery for a predetermined period of time to draw a predetermined current pulse from the battery while the battery is disconnected from the external load and means for sensing the voltage across the battery terminals when the selected test load is connected to the battery terminals. The apparatus further includes means for converting the voltage sensed to a visual signal of the state of charge of the battery.

In a preferred embodiment of the invention the means for selectively connecting the electrical test load to the battery draws a current from the battery having a magnitude approximately equal to the magnitude of current drawn from the battery when the battery is connected to the external load.

In a preferred embodiment of the invention the selected test load is connected to the battery after the battery has been connected to the external load for a selected period of time and after the battery has subsequently been disconnected from the external load for a selected period of time.

In one embodiment of the invention the means for converting the sensed voltage to a visual display includes a plurality of selectively illuminated display elements and means for converting the sensed voltage to a plurality of digital outputs transmitted to corresponding ones of the display elements.

One of the advantages of the invention is that the method and apparatus of the invention provide a functional means for producing an accurate readout of the charge remaining in the battery, and even though the discharge curve of the batteries is non-linear and the voltage of the battery drops off rapidly only as the battery reaches the latter half of its discharge cycle, the state of charge indicator embodying the invention provides an accurate expression of the charge left in the batteries.

This invention, as claimed, also provides a method of testing the state of charge of a battery, said method comprising the steps of connecting the battery to a first load, sensing how long the battery is connected to the first load, disconnecting the battery from the first load and connecting a second load to the battery after the battery has been connected to the first load for a predetermined period of time, and producing, in response to the second load being connected to the battery, a signal indicating the state of charge of the battery.

This invention, as claimed, also provides a state of charge indicator for testing the state of charge of a battery selectively connected to an operating load, said state of charge indicator comprising means for sensing if the battery is connected to the operating load, timing means for sensing how long the battery is connected to the operating load, a test load, means for connecting said test load to the battery in response to indication from said load connection sensing means of disconnection of the battery from the operating load after indication from said timing means that the battery was connected to the operating load for a predetermined period of time, and means for producing in response to said test load being connected to the battery a signal indicating the state of charge of the battery.

Various features of the invention are set forth in the following description of a preferred embodiment, in the claims and in the drawings.

Before describing at least one embodiment of the invention in detail, it is to be understood that the invention is not limited in its application to the details of construction and to the arrangement of the components set forth in the following description or illustrated in the drawings. The invention is capable of other embodiments and of being practiced and carried out in various ways. Also, it is to be understood that the phraseology and terminology employed herein is for the purpose of description and should not be regarded as limiting.

DESCRIPTION OF A PREFERRED EMBODIMENT

Figure 1:
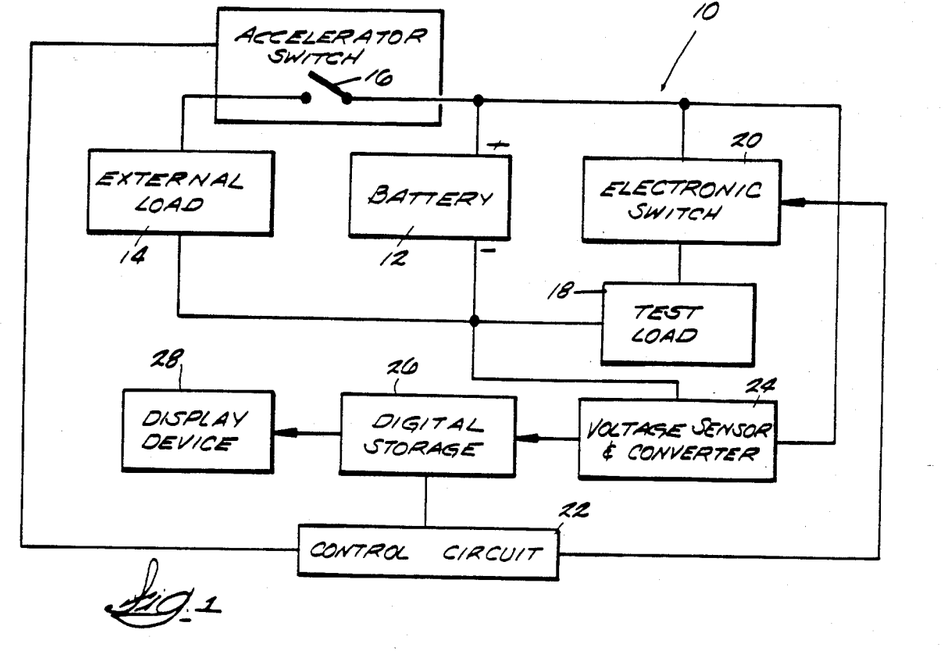
FIG. 1 is a schematic view of a state of charge measuring device embodying the invention.

Illustrated in FIG. 1 is a state of charge indicator 10 embodying the present invention and adapted to produce a visual signal indicating the state of charge of the battery 12 or a bank of batteries which can be, for purposes of example, batteries of the type used in electric vehicles. In the illustrated arrangement the battery 12 is electrically connected to an external load 14. In the case of an electric vehicle the external load 14 would include the electric motor of the vehicle. The means for electrically connecting the battery 12 to the external load 14 includes an accelerator switch 16 adapted to be closed when the accelerator pedal (not shown) of the vehicle is depressed and also adapted to be opened when the accelerator pedal is released.

While the state of charge indicator 10 described will be referred to, for purposes of example, in connection with an electric vehicle, it will be understood that the state of charge indicator 10 will have a variety of other uses and will be useful as a battery charge indicator in a number of other applications.

The state of charge indicator 10 shown in FIG. 1 includes an electrical test load 18 and means for selectively connecting the battery 12 to the test load 18 for a very brief period when the accelerator switch 16 has first been closed for a first predetermined length of time and when the accelerator switch 16 has subsequently been opened for a second predetermined length of time. The test load 18 comprises a resistance which produces a current pulse of relatively large magnitude from the battery 12, the magnitude of the current drawn by the test load 18 being intended to be approximately the same as the average current drawn by the external load 14. The means for selectively connecting the battery 12 to the test load 18 also includes an electronic switch means 20 adapted to selectively connect the test load 18 to the battery 12 and to then disconnect the test load 18 from the battery 12 after the passage of a short time interval. The means for selectively connecting also includes a control circuit means 22 for selectively causing the electronic switch means 20 to connect the test load 18 to the battery 12.

Means are further provided for sensing the voltage across the terminals of the battery 12 during the period when the battery 12 is connected to the test load 18. In the arrangement illustrated in FIG. 1, this sensing means includes a voltage sensor and converter 24 to be described in greater detail hereinafter. Means are also provided for converting the sensed voltage to a visual signal of the state of charge of the battery. In the illustrated arrangement this means includes a digital storage device 26 and a display device 28. During the period when the electronic switch means 20 connects the battery 12 to the test load 18, the voltage sensor and converter 24 converts the sensed voltage to a plurality of digital signals. These digital signals are then selectively transmitted from the voltage sensor converter 24 to the digital storage device 26 and the digital storage device 26, in turn, transmits the digital signals to the display device 28.

Referring now more specifically to the control circuit means 22, in the illustrated arrangement the control circuit means is provided with means for selectively causing the electronic switch 20 to connect the battery 12 to the test load 18 when the accelerator switch has first been closed for at least approximately 5 seconds and then has been opened for a second selected time period, such as ¾ of a second. By first requiring the battery 12 to be loaded for at least 5 seconds before the voltage sensor and converter 24 sense the voltage of the battery, the system prevents any erroneous readings of the terminal voltage of the battery which might otherwise occur due to the affects of battery recovery during long rest periods. For example, if the battery 12 is allowed to rest for an extended period of time, the voltage of the battery may return to an artificially high level and an initial sample of the terminal voltage of the battery 12 could show the battery to be fully charged. However, if the battery is discharged or connected to a load, the battery will quickly lose this high voltage level and return to a voltage level more nearly approximating that measured before the battery is allowed to rest.

The control circuit means 22 also includes means for transmitting a signal to the digital storage device 26 and to cause the delay of approximately 0.5 seconds after the voltage has first been sensed by the voltage sensor and converter 24 before the signals from the voltage sensor and converter 24 can be received by the digital storage device 26.

The control circuit 22 further includes means for transmitting a signal to the electronic switch means 20 causing the electronic switch means 22 to disconnect the test load 18 from the battery 12 after the signals from the voltage sensor and converter 24 have been transmitted to the digital storage means 26 and also received by the digital display device 28.

Referring now more particularly to the means for converting the sensed voltage to a visual signal, while the display device 28 could have various constructions, in a preferred from of the invention it can include a plurality of light emitting diodes arranged linearly and which will be described more particularly hereinafter. The light emitting diodes are electrically connected to the digital storage means 26 such that when the battery 12 is fully charged the digital signals transmitted to each of the diodes causes them to be illuminated, and then as the state of charge of the battery 12 is decreased, the signals to succeeding ones of the light emitting diodes are changed such that a decreasing number of diodes are illuminated. In the illustrated arrangement the display device includes 8 light emitting diodes, but it will be understood that in other arrangements other types of display devices could be used.

Figure 2:
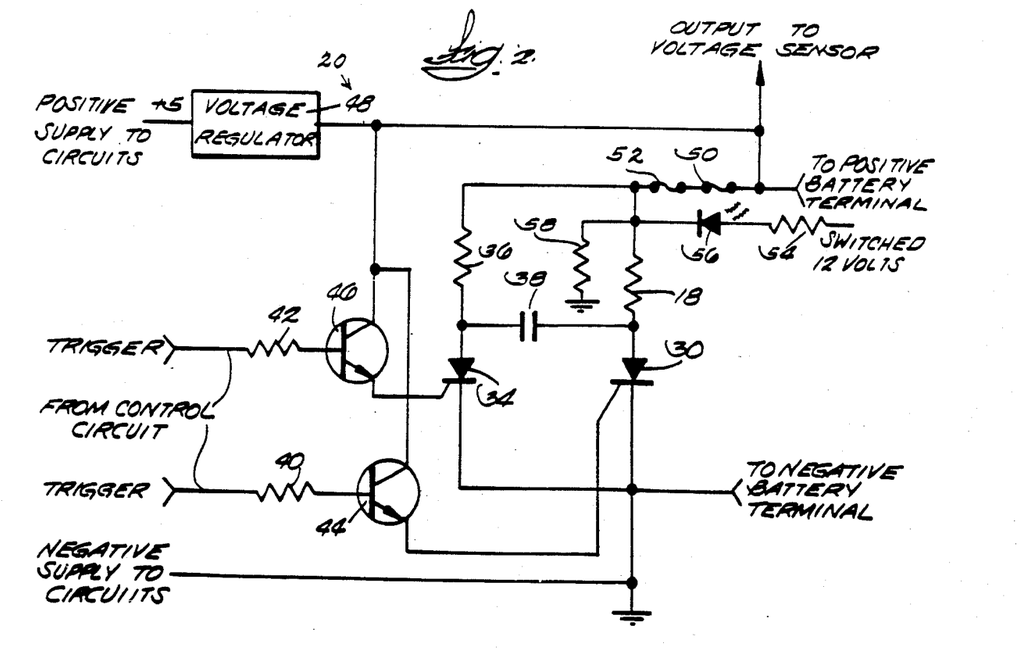
FIG. 2 is a schematic view of an electronic switch circuit embodied in the state of charge measuring device shown in FIG. 1.
Figure 3:
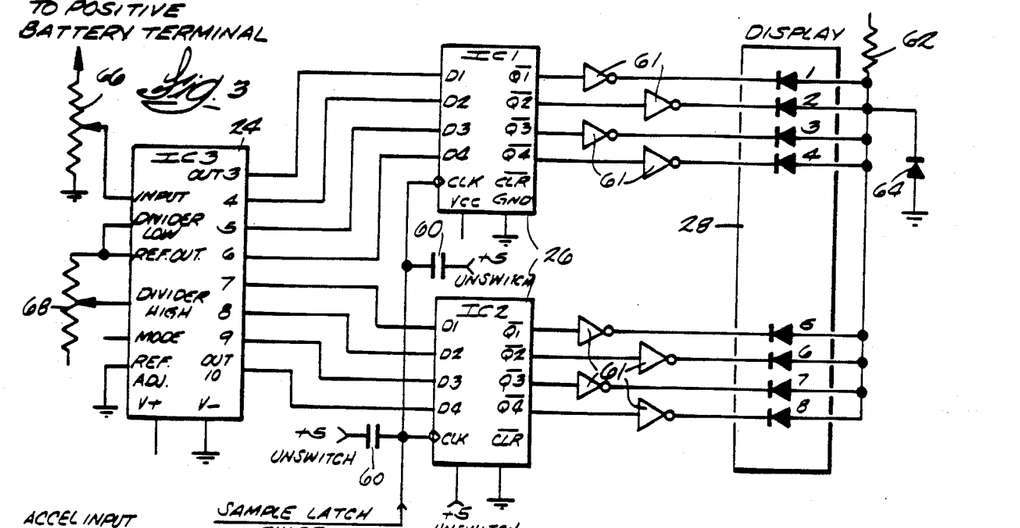
FIG. 3 is a schematic view of a voltage sensor and display assembly embodied in the state of charge measuring device illustrated in FIG. 1.
Figure 4:
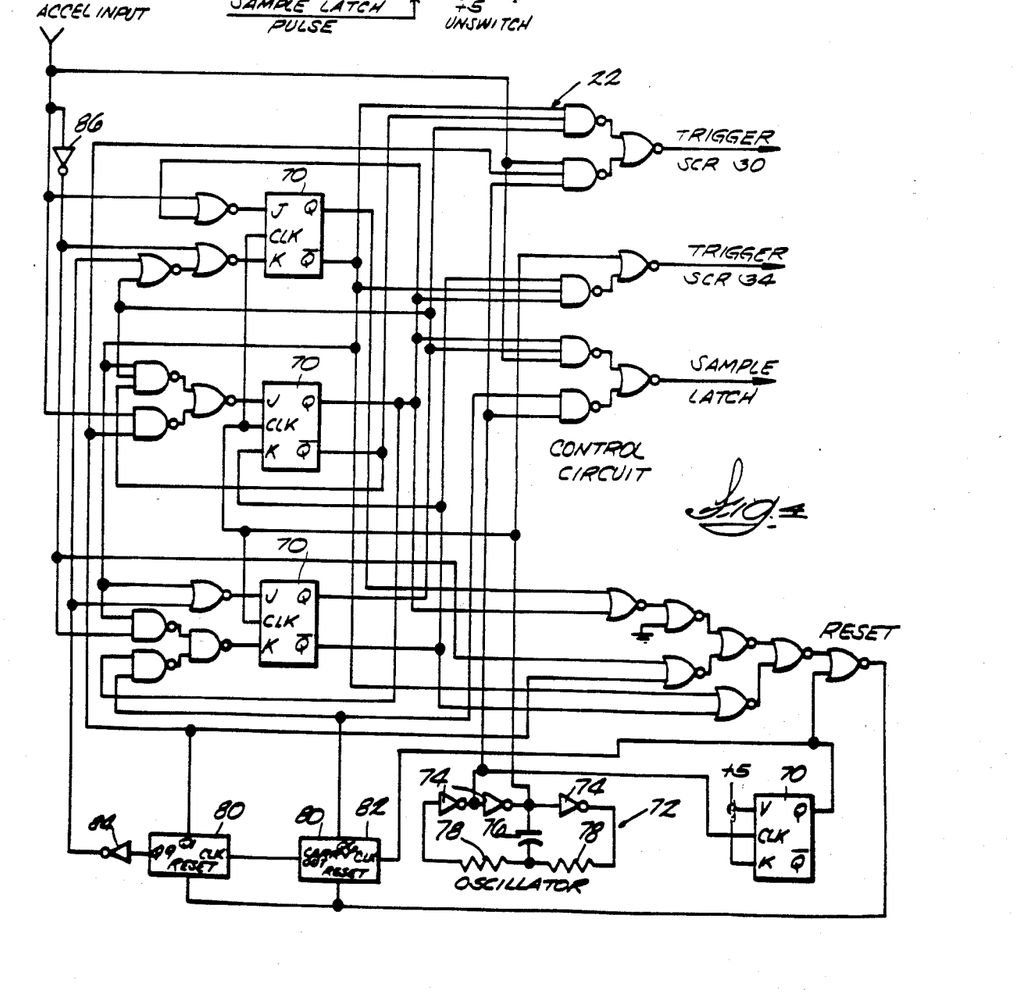
FIG. 4 is a schematic view of a control circuit embodied in the state of charge measuring device shown in FIG. 1.

FIGS. 2-4 illustrate more particularly one arrangement of electrical components and circuits which function to produce the results described above. Before describing in detail the specific apparatus illustrated in FIGS. 2-4, it should be understood that the functions of the control circuit 22, the voltage sensor and converter 24, and the digital storage device 28 could be implemented with a microprocessor with a minimum number of support components. Additionally, if the state of charge indicator is included in a vehicle having an onboard computer, many of these functions could be conveniently embodied in such a computer with a resulting substantial savings in cost of components. Furthermore, while in the following description the various components are described as being used in connection with testing the state of charge of a 12 volt battery adapted to produce a current of 25 amps, it will be understood that the illustrated apparatus could be conveniently modified for use in measuring the state of charge of batteries adapted to produce larger or smaller currents. For example, the state of charge indicator 10 could be conveniently modified so as to be useful in conventional electric vehicles of the type which commonly employ batteries adapted to generate 75 amperes.

FIG. 2 is a schematic view of the electronic components which preferably make up the electronic switch means or switch 20 diagramatically shown in FIG. 1 and also showing the test load 18 as comprising a resister electrically connected to the components of the electronic switch 20. Various electronic switch means arrangements are possible. In the preferred embodiment illustrated in FIG. 2, such switch means comprises a thyristor or SCR 30 which is triggered to selectively connect the test load 18 to the battery 12 to draw a relatively large predetermined current pulse from the battery 12, while the battery is disconnected from the external load 14.

The electronic switch 20 includes another SCR 34 connected in circuit with a resister 36 and capacitor 38 as illustrated to form a commutating circuit, i.e., triggering SCR 34 turns off SCR 30, and vice versa. Resisters 40 and 42 are connected to driver transistors 44 and 46, which in turn are connected to provide trigger pulses to SCRs 30 and 34, respectively, subject to trigger outputs from the control circuit means 22, as will be described further below. A voltage regulator 48 is connected to the battery to provide a 5 volt positive supply as shown.

Two fuses 50 and 52, respectively, are connected as shown. Fuse 50 preferably should be a fast acting fuse that will blow if any current above $I_T$ (load current during test) flows in the circuit. Fuse 52 preferably should be a slower acting breaker (about one second before blowing) that will blow if a current of about $I_T/2$ flows in the circuit for an extended period of time. This protects the components in the evnt that the SCR 30 gets "stuck" on or the control circuit malfunctions.

A fuse out indicator, made up of a resistor 54 connected to a switched 12 volt supply and to an LED 56, in turn connected to a grounded resistor 58, is also provided.

The design of the commutating circuit will be set forth more specifically below. For purposes of discussion, the commutating resistor 36 has a value equal to $R_c$, the test load resistor 18 has a value equal to $R_1$ and the saturation voltage of SCR 30 has a value equal to $V_{SCRSat}$. E is the no-load battery voltage
$I_T$=current through the test load 18 during the test interval.

$R_L$ is chosen first.

It is known $E - V_{SCRSat.} = I_T R_L$
so $$R_L = (E - V_{SCRSat.})/I_T \qquad (1)$$

C (the capacitance of capacitor 38) must be large enough to keep SCR 30 reverse biased through its entire turnoff time, $T_{off}$.

$$T_{off} = R_L C$$

or $$C = T_{off}/R_L) \qquad (2)$$

Given the conduction time, $T_c$, of SCR 30, the resistance $R_C$ may be found.

$$T_C = R_C C$$

or $$R_C = (T_C/C) \qquad (3)$$

$T_C$ should be made large enough so that $R_C$ is large and the current drain of $I_{RC}$ is not substantial. $T_C$ is fixed at approximately 0.5 seconds by the control circuit 22. A safety factor of 2 will be incorporated into equations (2) and (3) giving $$C = (2T_{off}/R_L) \qquad (2a)$$

and $$R_C = (T_C/2C) \qquad (3a)$$

In the illustrated embodiment, testing was done on a 12 volt battery of the type rated to produce a current of 25 amperes. Accordingly, the commutating circuit was designed for E=12 volts and I=25 amperes.

The SCRs used were General Electric C122s.

The saturation voltage of the SCRs was found to be approximately 2.5 volts at 25 amps. The turn off time was estimated to be 80 microseconds.

Using these values, $R_L$, and $R_C$ and C were calculated.

$R_L$=0.38 Ohms (made from Nichrome wire)
$R_C$=532 Ohms (470 Ohms was used)
C=421 Micro Farads (a 470 Micro Farad was used in the circuit)

The above discussion of design demonstrates one of the advantages of this invention. The state of charge indicator can be made to work with a variety of batteries by simply changing the values of $R_L$, $R_C$ and C.

A further description of the electronic switch 20 will be given in the detailed description of operation section after description of the schematic circuit arrangements shown in FIGS. 3 and 4.

FIG. 3 is a schematic view of the voltage sensor and converter 24, the digital storage means 26, and the display device 28. Various voltage sensor and display means arrangements are possible. In the preferred embodiment illustated in FIG. 3, the voltage sensor and converter 24 comprises a logarithmic LED bar graph driver, the digital storage means 26 is comprised of a pair of Quad D flip-flops, and the display device 28 comprises an 8 LED bar graph display, all connected as illustrated. As shown, the digital storage means or flip-flops 26 are connected to an unswitched 5 volt supply provided by voltage regulator 48 (FIG. 2). The 5 volt supply is unswitched so that the state of charge is retained when other switched components are turned off. The digital storage clock inputs (CLK) are connected to the sample latch output of the control circuit 22 as shown and further described below. Noise filter capacitors 60 are connected to the unswitched 5 volt supply and the flip-flops 26 as shown. In addition, inverter/drivers 61 are connected between the outputs of the flip-flops 26 and the LED bar graph display 28 as shown. The anodes of the eight LEDs, numbered 1 through 8, of the bar graph display are connected through resistor 62 to a switched 5 volt supply provided by the voltage regulator 38. A protective diode 64 is connected between the anodes and ground to limit reverse voltage spikes across the LEDs. The voltage sensor and converter 24 is connected to the positive battery terminal or battery voltage to be sampled via potentiometer 66. In addition, a potentiometer 68 is connected to driver 24 to allow for calibration of the state of charge indicator 10 as will be further described in the detailed description of operation section below.

FIG. 4 is a schematic view of the control circuit means 22, as diagramatically shown in FIG. 1. While various control circuit means arrangements are possible, in the preferred embodiment illustrated in FIG. 4, such means comprises a digital logic circuit including NAND or NOR gates (not separately labelled), our dual JK master slave flip-flops 70 with set and reset, model 4027, an oscillator, generally designated 72, and made up of three inverter/drivers 74, a capacitor 76 and two resistors 78, and a counter 80 made up two decade converter/drivers 82 with 10 decade outputs, model 4017, all connected as shown. An inverter/driver 84 is connected to the Q9 output of counter 80 and a inverter/driver 86 is connected at the accelerator input as shown.

The digital logic and other components which have been described and which make up the state of charge indicator 10 can be made up separately available commercial components, having generic model numbers as designated below. Such components are available from National Semiconductor Corporation unless specifically designated otherwise below. Before continuing with a detailed description of operation, a list of components and component values corresponding to components identified in the above description is given below.

With reference to components illustrated in FIG. 2:
SCR 30—GE C122-3
SCR 34—GE C122-3
Transistor 44—2N2222
Transistor 46—2N2222
Voltage Regulator 48—7805K
Resistor 32—0.38 Ohms (Nichrome Wire)
Commutating Resistor 36—470 Ohms
Resistor 54—470 Ohms
Resistor 40 and 42—470 Ohms
Capacitor 38—470 Micro Farads With reference to components illustrated in FIG. 3:
Logrithmic LED Bar Graph Driver—LM 3915
Quad D flip-flops 26—74LS175
Inverter/Drivers (not specifically labelled)—4049-CMOS
Potentiometer 66—5K Ohm multi-turn potentiometer
Potentiometer 68—500 Ohm potentiometer
Resistor 60—120 Ohms With reference to the components illustrated in FIG. 4:
Flip-flops 70—4027 dual JK master slave flip-flop with set and reset
Counter 80—Two 4017 Decade counter/dividers with 10 decade outputs
NAND and NOR gates (not specifically labeled)—
  Standard 4000 series CMOS logic gates
  4023 (3 input NAND gates)
  4011 (2 input NAND gates)
  4001 (2 input NOR gates)
Resistors 78—56K Ohm
Capacitor 76—0.44 Micro Farads

Detailed Description of Operation

Referring to the control circuit 22 shown in FIG. 4, the control circuit includes 4 inputs which are processed so that the digital logic circuitry selectively provides 4 outputs. These outputs include a trigger pulse to SCR 30, a trigger pulse to SCR 34, a sample latch pulse, and a reset signal to counter 80. The trigger pulse to SCR 30 results in connecting the predetermined electrical test load 18 to the battery, and the trigger pulse to SCR 34 results in turning off SCR 30, disconnecting test load 18, and connecting the commutating resistor 36 to the battery 12. The sample latch pulse results in the digital signal output from the bar graph driver 24 being stored in the flip-flops 26 and displayed by the LED bar graph display 28. The reset pulse causes counter 80 to initiate a new count to produce inputs to the digital circuitry which results in producing the outputs just described.

A normal cycle of testing the state of battery charge is as follows. Assuming the accelerator pedal is down and the battery is connected to an external load 14, the counter 80 begins to count pulses from the oscillator 72 and after approximately 5 seconds, the output from Q9 of counter 80 enables the control circuit means 22 for a test. If thereafter, the pedal is released and moved up, a 5 volt signal is applied, and the counter 80 is reset and counts for a short delay time of approximately $\frac{3}{4}$ of a second. The counter 80 then produces an output which causes the control circuit means 22 to produce a trigger pulse transmitted to SCR 30. This causes the known test load 18 to be placed across the battery terminals causing the predetermined current pulse to flow out of the battery. During the period when the test load 18 is connected to the battery 12, the battery voltage is sensed by the voltage sensor and converter 24 and converted to a plurality of digital outputs which are presented to the digital storage means or flip-flops 26. At the end of the $\frac{3}{4}$ second period, the counter 80 again resets and counts for a short delay period, approximately $\frac{1}{2}$ of a second, and thereafter produces an output which causes the control circuit 22 to produce a sample latch pulse which causes the digital signals produced by the voltage sensor 24 to be transferred into the digital storage device 26, the sample latch pulse being transmitted to the clock inputs of the flip-flops 26 as illustrated. The value of the storage signal represents the battery state of charge and is displayed in linear fashion by the bar graph display 28. After the sample latch pulse, the next clock pulses cause the control circuit to produce a trigger pulse transmitted to SCR 34 to disconnect the test load 18 and end the test. The trigger pulse for SCR 34 occurs approximately $\frac{1}{4}$ of a second after the sample latch pulse. This completes the test process if the accelerator pedal has remained undepressed during the entire test period, approximately 1.5 seconds. If the accelerator pedal were depressed during the test period, the sequence of steps described above would be unaltered, except that the sample latch pulse would not be produced so that the state of charge display would remain unchanged from the prior completed test. This prevents storing an erroneous value in the digital storage device 26, which could be caused by unknown loading of the battery 12 if the accelerator were depressed during the test.

The test process will not be initiated unless the accelerator pedal has been down for at least 5 seconds prior to the accelerator pedal being released and the test process being initiated. This minimum down time of 5 seconds prevents erroneous reading of battery voltage which may result from battery recovery or surface charge. Similarly, the predetermined time of $\frac{1}{2}$ of a second during which the test load is connected to the battery is provided for the battery voltage to stabilize and remove any battery surface charge so that an accurate state of charge reading can be obtained. The initial $\frac{3}{4}$ of a second delay prior to connecting the test load is to prevent erroneous reading of transient battery voltage resulting from disconnection from the external load.

Figure 5:
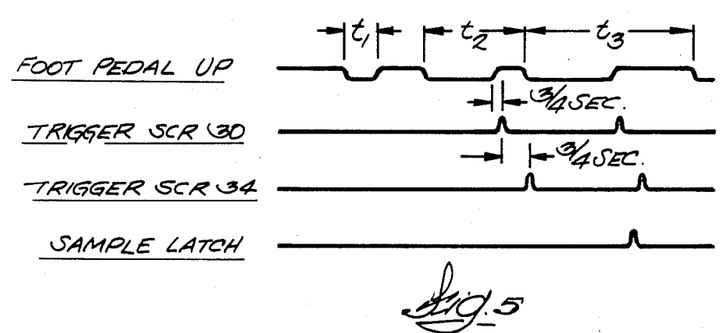
FIG. 5 is a schematic illustration of the control circuit timing of the state of charge measuring device illustrated in FIG. 1.

FIG. 5 comprises a control circuit timing diagram which graphically illustrates the description of operation given above. During the period of time noted as $t_1$, the accelerator foot pedal is depressed for a time less than the minimum downtime of approximately 5 seconds. If this condition occurs, no action is taken by the control circuit 22. The battery must be loaded for at least 5 seconds before the system is able to take a voltage sample, thus minimizing erroneous readings due to battery recovery during long rest periods.

The period of time designated $t_2$ illustrates the situation wherein the accelerator foot pedal is depressed for a time greater than the minimum down time, released, then depressed again before the sampling process is complete. In this situation the control circuit triggers SCR 30, delays $\frac{3}{4}$ of a second and then triggers the SCR 34. No sample latch occurs and thus no voltage sample is entered into the digital storage 26. The time period $t_3$ illustrates a normal sampling cycle. In this situation, the control circuit triggers SCR 30, waits approximately $\frac{1}{2}$ of a second, takes a voltage sample, and approximately $\frac{1}{4}$ of a second later triggers SCR 34 to disconnect the test load.

In summary, during a normal battery voltage test cycle, assuming the accelerator pedal has been depressed for 5 seconds or longer prior to the pedal being released, the test load 18 will be connected to the battery after a short time delay, on the order of $\frac{3}{4}$ of a second. The battery voltage sensed will be converted and stored in the digital storage 26 after a short delay, on the order of $\frac{1}{2}$ of a second, causing the state of charge to be displayed on the LED bar graph display 28. After another short delay on the order of $\frac{1}{4}$ of a second, the test load 18 will be disconnected from the battery 12 with SCR 34 being turned on and the commutating resistor 36 remaining connected to the battery until a test cycle is repeated. The commutating resistor 36 is of a relatively high resistance to minimize current drain from the battery.

Figure 6:
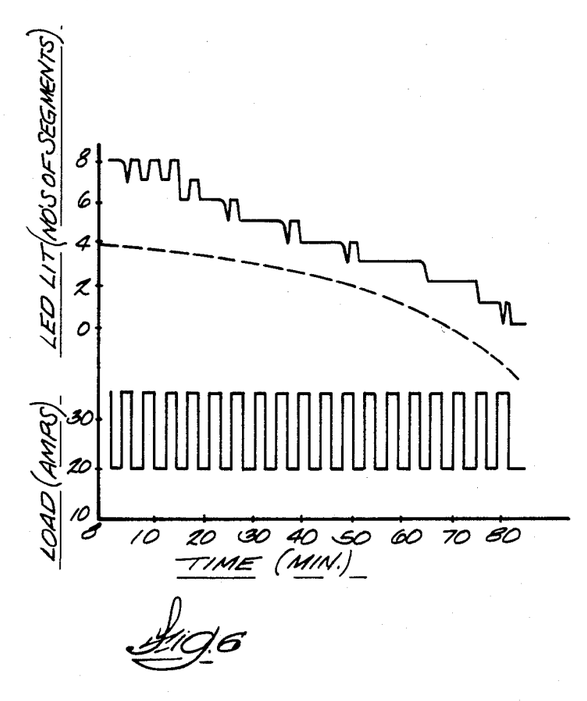
FIG. 6 is a schematic illustration of a typical discharge curve of a battery of the type adapted to be measured using the state of charge measuring device of the invention.

As noted earlier in the general description, a relatively large current pulse, approximately 25 amps, is drawn by the test load 18. This current is equal to the rated current of a typical lead-acid battery and is utilized in connection with generation of a battery voltage discharge curve such as is illustrated in FIG. 6. Referring to FIG. 6, the battery discharge curve is generated in response to the battery being selectively connected to a test load to draw 25 amps over a period of 80 minutes. For a typical 12 volt battery of the type designed to produce a 25 amp current, and assuming a current draw of 25 amperes as illustrated in FIG. 6, the battery voltage discharge curve ranges from a voltage of approximately 11.8 volts at full charge to 10.5 volts, which represents full discharge of the battery. As is apparent from the battery voltage discharge curve, such curve is non-linear and similar to a logarithmic curve in that the battery voltage begins to decrease more rapidly as the battery reaches its full discharge state. The battery voltage decreases because the internal resistance of the battery decreases as the battery becomes discharged. The voltage sensor and converter 24 operates to electrically process the sensed voltage of the battery to compensate for the non-linear battery discharge curve to provide a substantially linear visual signal of the state of charge of the battery. In the preferred embodiment as illustrated, outputs 3 through 10 of the logarithmic LED bar graph driver 24 were utilized to provide the digital signals to be stored and to illuminate the 8 LEDs in the bar graph display 28. As illustrated by the top line in FIG. 6, 8 LEDs are illuminated when the battery has a full charge, 7 LEDs are illuminated when the battery voltage drops to 11.7 volts, 6 LEDs are illuminated when the battery voltage drops to 11.63 volts, etc. As is apparent from FIG. 6, the voltage sensor and converter means processes the voltage to compensate for the non-linear battery voltage discharge curve to provide a substantially linear visual signal of the state of charge of the battery. Other voltage sensor and converter means arrangements could be utilized to process the sensed voltage and compensate for the non-linear battery voltage discharge curve.

Calibration of the state of charge indicator 10 as described above is achieved by connecting a fully charged battery, subject to a 25 amp load, to the voltage sensor and adjusting potentiometer 66 until all the LEDs of the bar graph display 28 are just turned on. The potentiometer 66 reduces the voltage sensed to approximately a 5 volt range. Thereafter, to calibrate for the fully discharged battery state, 10.5 volts is connected to the voltage sensor 24 and potentiometer 68 is adjusted until the last one of the LEDs just turns off. The logarithmic LED bar graph driver 24 Model LM3915 internally utilizes voltage comparators and a series of resistors which provide outputs (3–10) which sequentially turn off LEDs 1 through 8 as the battery voltage sensed drops from 11.8 to 10.5 volts. The logarithmic-like characteristic of the bar graph driver 24 provides reasonably good compensation for the non-linear battery voltage discharge curve so that the resultant state of charge indicator provides a linear visual display representative of the state of charge remaining before the battery is fully discharged. Put another way, the visual state of charge is linear because the relationship between the battery state of charge and the number of LEDs illuminated is such that a change in one is generally proportional to a change in the other, i.e., when $\frac{1}{8}$ of the battery charge has been utilized, 7 of 8 diodes are illuminated, when $\frac{1}{2}$ of the battery charge has been expended, 4 of 8 diodes are illuminated, when $\frac{3}{4}$ of the battery charge has been utilized, 2 of the 8 LEDs are illuminated, etc.

It should be appreciated that the invention can be applied and used with batteries other than lead-acid batteries, by establishing a battery voltage discharge curve for the battery to be tested and then providing a voltage sensor and converter which compensates for the non-linear curve to provide a linear visual display of the battery state of charge. Also, as discussed earlier, a state of charge indicator can be made to work with a variety of voltages and/or currents by changing the values of the test load 18, commutating resistor 36, and commutating capacitor 38 included in the electronic switch means 20. For example, the tester could be utilized by making such modifications with electrical vehicle batteries of the type having a standard test load drawing 75 amps from the batteries.

It is to be understood that the invention is not confined to the particular method and particular construction and arrangement of circuit components herein illustrated and described, but embraces all such modifications thereof as come within the scope of the following claims.

I claim:

1. A state of charge indicator for testing the state of charge of a battery selectively connected to an operating load, said state of charge indicator comprising means for sensing if the battery is connected to the operating load, timing means for sensing how long the battery is connected to the operating load, a test load, means for connecting said test load to the battery in response to indication from said load connection sensing means of disconnection of the battery from the operating load after indication from said timing means that the battery was connected to the operating load for a predetermined period of time, and means for producing in response to said test load being connected to the battery a signal indicating the state of charge of the battery.

2. A state of charge indicator in accordance with claim 1 wherein said test load approximates the operating load.

3. A state of charge indicator in accordance with claim 1 wherein said signal producing means comprises means for sensing a voltage of the battery while said test load is connected to the battery for a second predetermined period of time, and means for converting said sensed voltage to the signal indicating the state of charge of the battery.

4. A state of charge indicator in accordance with claim 3 and further including means for interrupting said voltage converting means if the operating load is connected to the battery before said voltage sensing means has sensed said voltage for said second predetermined period of time.

5. A state of charge indicator in accordance with claim 3 and further including means for maintaining said state of charge signal until said voltage sensing means next completes sensing said voltage for said second predetermined period of time.

6. A state of charge indicator in accordance with claim 1 wherein said timing means also senses how long the battery is disconnected from the operating load, and wherein said test load connecting means connects said test load to the battery after said timing means indicates the battery has been disconnected from the operating load for a short second predetermined period of time.

7. A state of charge indicator in accordance with claim 6 wherein said short second predetermined period of time is about three-fourths of a second.

8. A state of charge indicator in accordance with claim 1 wherein said test load connecting means connects said test load to the battery within about one second after the battery has been disconnected from the operating load.

9. A state of charge indicator in accordance with claim 1 wherein said means for sensing connection of the battery to the operating load includes an accelerator switch.

10. A state of charge indicator in accordance with claim 1 wherein said predetermined period of time is about five seconds.

11. A state of charge indicator in accordance with claim 1 and further including means for storing said signal, and means for converting said stored signal to a visual display.

12. A state of charge indicator as set forth in claim 11 and wherein said means for converting said stored signal to said visual display includes a plurality of selectively illuminated display elements, and means for converting said stored signal to a plurality of digital outputs transmitted to corresponding ones of said display elements and for causing said ones of said display elements to be illuminated.

13. A method of testing the state of charge of a battery, said method comprising the steps of connecting the battery to a first load, sensing how long the battery is connected to the first load, disconnecting the battery from the first load and connecting a second load to the battery after the battery has been connected to the first load for a predetermined period of time, and producing, in response to the second load being connected to the battery, a signal indicating the state of charge of the battery.

14. A method in accordance with claim 13 wherein the signal is produced by the steps of sensing a voltage of the battery while the second load is connected to the battery for a second predetermined period of time, and converting the sensed voltage to the sigal indicating the state of charge of the battery.

15. A method in accordance with claim 14 and further including the step of interrupting the converting of the sensed voltage to a signal if the first load is connected to the battery before the voltage is sensed for the second predetermined period of time.

16. A method in accordance with claim 14 and further including the step of maintaining the state of charge signal until the voltage is next sensed for the second predetermined period of time.

17. A method in accordance with claim 14 and further including the steps of transmitting the signal to a storage device, and converting the stored signal to a visual display.

18. The method as set forth in claim 17 wherein the step of converting the stored signal to a visual display includes the steps of transmitting the stored signal to a plurality of selectively illuminated display elements, the number of display elements illuminated being dependent on the stored signal transmitted.

19. The method as set forth in claim 17 and further including the step of maintaining the visual display until the prior recited steps are repeated.

20. A method in accordance with claim 13 and further including the step of sensing how long the battery is disconnected from the first load, and wherein the second load is connected to the battery after the battery has been disconnected from the first load for a short second predetermined period of time.

21. A method in accordance with claim 20 wherein said short second predetermined period of time is about three-fourths of a second.

22. A method in accordance with claim 13 wherein the second load is connected to the battery within about one second after the battery has been disconnected from the first load.

23. A method in accordance with claim 13 wherein the predetermined period of time is about five seconds.

24. A method in accordance with claim 13 and further including the steps of selectively storing the signal, and converting the stored signal to a visual display.

25. A method in accordance with claim 13 wherein the second load is different from the first load.

* * * * *